(12) United States Patent
Kinoshita

(10) Patent No.: US 11,031,522 B2
(45) Date of Patent: Jun. 8, 2021

(54) OPTICAL SEMICONDUCTOR ELEMENT COMPRISING N-TYPE ALGAN GRADED LAYER

(71) Applicant: STANLEY ELECTRIC CO., LTD., Tokyo (JP)

(72) Inventor: Toru Kinoshita, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 27 days.

(21) Appl. No.: 16/213,287

(22) Filed: Dec. 7, 2018

(65) Prior Publication Data

US 2019/0189834 A1    Jun. 20, 2019

(30) Foreign Application Priority Data

Dec. 15, 2017    (JP) .............................. JP2017-240978

(51) Int. Cl.
*H01L 33/00*    (2010.01)
*H01L 33/32*    (2010.01)
*H01L 33/12*    (2010.01)

(52) U.S. Cl.
CPC .......... *H01L 33/0025* (2013.01); *H01L 33/12* (2013.01); *H01L 33/32* (2013.01); *H01L 33/0075* (2013.01)

(58) Field of Classification Search
CPC .................................................. H01L 33/0025
See application file for complete search history.

(56) References Cited

U.S. PATENT DOCUMENTS

| 6,534,795 B2 | 3/2003 | Hori et al. |
| 8,227,789 B2 | 7/2012 | Hirayama et al. |
| 9,437,430 B2 | 9/2016 | Schowalter et al. |
| 2011/0001127 A1* | 1/2011 | Sakamoto ......... H01L 21/02458 257/22 |
| 2018/0287014 A1* | 10/2018 | Asada .................... H01L 33/32 |

FOREIGN PATENT DOCUMENTS

| JP | 4063520 B2 | 3/2008 |
| JP | 5641173 B2 | 12/2014 |
| JP | 5730484 B2 | 6/2015 |

OTHER PUBLICATIONS

J.R. Grandusky, et al., "Pseudomorphic growth of thick n-type AlxGa1-xN layers on low-defect-density bulk AlN substrates for UV LED applications," Journal of Crystal Growth, 311 (2009), pp. 2864-2866.

* cited by examiner

*Primary Examiner* — Daniel Whalen
(74) *Attorney, Agent, or Firm* — Holtz, Holtz & Volek PC

(57) ABSTRACT

An optical semiconductor element comprises: an AlN substrate; an n-type semiconductor layer composed of an AlGaN layer, the AlGaN layer being grown on the AlN substrate and being pseudomorphic with the AlN substrate, an Al composition or the AlGaN layer being reduced with an increase in distance from the AlN substrate; an active layer which is grown on the n-type semiconductor layer; and a p-type semiconductor layer which is grown on the active layer.

23 Claims, 4 Drawing Sheets

OPTICAL SEMICONDUCTOR ELEMENT COMPRISING N-TYPE ALGAN GRADED LAYER

BACKGROUND OF THE INVENTION

1. Field of the Invention

The present invention relates to an optical semiconductor element such as a semiconductor light-emitting element and a semiconductor light-receiving element.

2. Background Art

In recent years, an AlGaN-based semiconductor light-emitting element chat has emission peak wavelengths in a deep ultraviolet region (for example, 200 nm to 300 nm) receives attention in an air and water sterilization application field, as a new light source substituted for a mercury lamp, which has been mainly used as an ultraviolet light source. As such an AlGaN-based semiconductor light-emitting element, for example, Japanese Patent No. 4063520 and Japanese Patent No. 5641173 disclose deep ultraviolet light-emitting elements in which AlGaN-based semiconductor layers are laminated on single crystalline sapphire, which is generally used as a substrate for a blue light-emitting diode. Japanese Patent No. 5730484 also discloses, for example, a pseudomorphic semiconductor heterostructure in which an AlGaN-based semiconductor layer is epitaxially grown using an aluminum nitride single crystal (AlN), as a substrate material, and a deep ultraviolet light-emitting element including the heterostructure.

It is preferable that an optical semiconductor element such as a semiconductor light-emitting element have high light-emitting efficiency or high light-receiving efficiency. For this purpose, for example, it is preferable that optical semiconductor layers for receiving or emitting light have high crystalline quality, more specifically, have reduced crystal defect density such as threading dislocation, which causes a deterioration in the light-emitting efficiency or the light-receiving efficiency. From the viewpoint of power conversion efficiency, it is preferable that an operation voltage for driving the optical semiconductor element is reduced, and therefore the optical semiconductor layers have a low electric resistance.

Particularly, the optical semiconductor elements for receiving and emitting light having wavelengths in the deep ultraviolet region are susceptible to improvement at least in terms of the light-emitting efficiency and the light-receiving efficiency. For example, in the deep ultraviolet optical semiconductor element, the optical semiconductor layer including an active layer is constituted of an AlGaN layer having a high Al composition.

The AlGaN layer having the high Al composition is grown on an AlN substrate in a state of having the same lattice constant as the AlN substrate, in other words, in a pseudomorphic state. Therefore, the AlGaN layer having high crystalline quality can be formed. However, when the AlGaN layer having the high Al composition is grown on the AlN substrate, since the AlGaN layer receives a compression distortion, a maximum film thickness (critical film thickness) that can maintain the pseudomorphic state becomes extremely small.

For example, in Journal of Crystal Growth 311 (2009) pp. 2864-2866, there is described that, when an AlGaN ($Al_{0.5}Ga_{0.5}N$) layer having an Al composition of 50% is grown on an AlN substrate, a critical film thickness is minuscule 0.5 µm or less. As described above, it is often difficult to epitaxially grow an AlGaN layer having a desired layer thickness, while maintaining a pseudomorphic state.

When the AlGaN layer used in the optical semiconductor element has a smaller layer thickness than a desired layer thickness, an electric resistance is increased in a parallel direction (hereinafter also referred to as a lateral direction) to a growth plane of the AlGaN layer. An operation voltage thereby increases, and current spread in the semiconductor layer is inhibited, thus causing a deterioration in light-emitting efficiency.

In an in-type AlGaN layer to be grown on an AlN substrate, in particular, since a layer thickness is reduced from the viewpoint of the above-described critical film thickness, an increase in resistance in a lateral direction causes a large increase in an operation voltage of an optical semiconductor element. In an optical semiconductor element having both of an n-electrode and a p-electrode on one surface of an optical semiconductor layer, an operation voltage increases conspicuously. A deterioration in the crystalline quality of the n-type AlGaN layer also has adverse effects on the crystalline quality of an active layer and a p-type semiconductor layer that are grown thereafter.

When an optical semiconductor element is mounted on a mounting board by, for example, flip-chip mounting, light is taken out or in through an n-type AlGaN layer and an AlN substrate. In this instance, since Fresnel reflection occurs at an interface between the AlN substrate and the n-type AlGaN layer, owing to the difference of a refractive index, light taking-out efficiency or light taking-in efficiency is reduced.

Considering the above circumstances, the present invention aims at providing a deep ultraviolet optical semiconductor element that has an n-type AlGaN layer having a desired layer thickness, high quality, and high Al composition, and operates at a low operation voltage with high light emitting and receiving efficiencies.

An optical semiconductor element according to the present invention includes: an AlN substrate; an n-type semiconductor layer composed of an AlGaN layer, the AlGaN layer being grown on the AlN substrate and being pseudomorphic with the AlN substrate, an Al composition of the AlGaN layer being reduced with an increase in distance from the AlN substrate; an active layer which is grown on the n-type semiconductor layer; and a p-type semiconductor layer which is grown on the active layer.

An optical semiconductor element according to the present invention includes: an AlN substrate; an n-type semiconductor layer composed of an AlGaN layer, the AlGaN layer being grown on the AlN substrate and being pseudomorphic with the AlN substrate, an Al composition of the AlGaN layer being reduced with an increase in distance from the AlN substrate; an active layer which is grown on the n-type semiconductor layer; and a p-type semiconductor layer which is grown on the active layer, wherein the n-type semiconductor layer includes: a first composition gradient layer which is grown on the AlN substrate and has an AlN composition on a side of the AlN substrate in a range between 0.95 to 1 and the AlN composition of which is gradually reduced to 0.7 to 0.8 at a first rate from, the AlN substrate to the active layer, and a second composition gradient layer which is grown on the first composition gradient layer, and an Al composition of which is gradually reduced at a second rate smaller than the first rate from the first composition gradient layer to the active layer.

An optical semiconductor element according to the present invention includes: an AlN substrate; an n-type semiconductor layer composed of an AlGaN layer, the AlGaN layer being grown on the AlN substrate and being pseudomorphic with the AlN substrate, an Al composition of the AlGaN layer being reduced with an increase in distance from the AlN substrate; an active layer which is grown on the n-type semiconductor layer; and a p-type semiconductor layer which is grown on the active layer, wherein the n-type semiconductor layer includes: a first composition gradient layer which is grown on the AlN substrate and has an AlN composition on a side of the AlN substrate in a range between 0.95 to 1 and the AlN composition of which is gradually reduced at a rate in a range between 0.5 to 2/μm from the AlN substrate to the active layer, and a second composition gradient layer which is grown on the first composition gradient layer, and an Al composition of which is gradually reduced at a rate of 0.1 to 1/μm from the first composition gradient layer to the active layer.

DETAILED DESCRIPTION OF THE INVENTION

An embodiment of the present invention will be described below in detail.

First Embodiment

Figure 1:
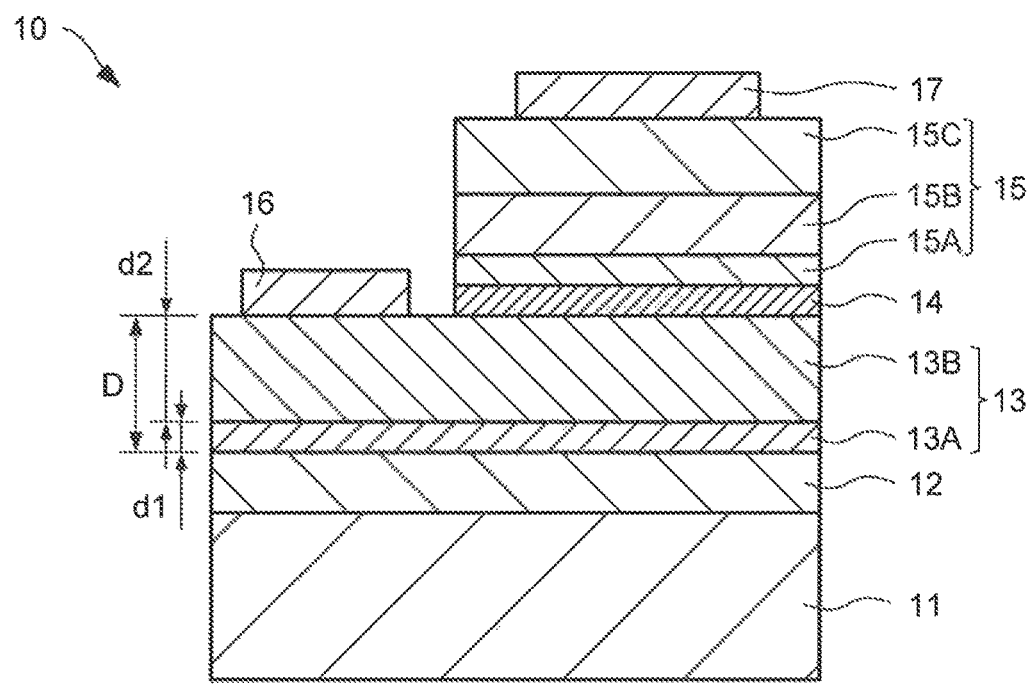
FIG. 1 is a cross-sectional view of an optical semiconductor element according to a first embodiment.
Figure 2:
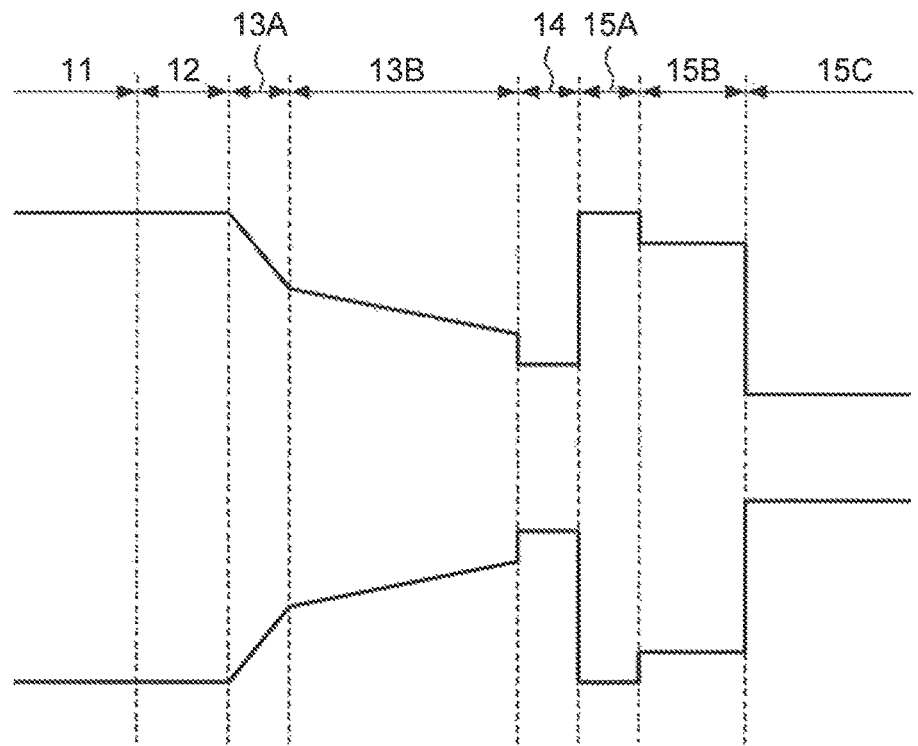
FIG. 2 is a band diagram of the optical semiconductor element according to the first embodiment.

FIG. 1 is a cross-sectional view of an optical semiconductor element 10 according to a first embodiment. FIG. 2 is a band diagram, of the optical semiconductor element 10. The optical semiconductor element 10 is a semiconductor element that performs a photoelectric conversion, and, for example, a semiconductor light-emitting element. An instance in which the optical semiconductor element 10 is a semiconductor light-emitting element will be hereinafter described, and the optical semiconductor element 10 is referred to as a light-emitting element. The light-emitting element 10 is a deep ultraviolet light-emitting element having an emission peak wavelength in a region of, for example, 200 nm to 300 nm.

The light-emitting element 10 has an AlN single crystal substrate (hereinafter referred to as AlN substrate) 11, and a buffer layer 12, an n-type semiconductor layer 13, an active layer 14, and a p-type semiconductor layer 15 that are formed on or above the AlN substrate 11.

The light-emitting element 10 can be produced, using the AlN substrate 11 as a growth substrate, by sequentially growing the buffer layer 12, the n-type semiconductor layer 13, the active layer 14, and the p-type semiconductor layer 15 in this order on or above the AlN substrate 11.

The structure of each layer of the light-emitting element 10 will be described with reference to FIGS. 1 and 2.

The AlN substrate 11 is not particularly limited, but preferably has a low dislocation density. The dislocation density of the AlN substrate 11 is preferably $10^6$ cm$^{-2}$ or less, and more preferably $10^4$ cm$^{-2}$ or less. Using the AlN substrate 11 having the low dislocation density can reduce the dislocation density of the semiconductor layers laminated on or above the AlN substrate 11, thus resulting in an improvement in light-emitting efficiency or light-receiving efficiency. The lower limit of the dislocation density is 0 cm$^{-2}$. Note that, the dislocation density may be measured by a known method, such as measurement of the number of dislocations from a transmission electron microscope image, or measurement of the number of etch pits after being immersed in a heated acid mixture solution.

In the present invention, the crystal growth plane of the AlN substrate 11 is a C-plane. The crystal growth plane may be a slightly inclined (off) plane from the C-plane. In such a case, an off angle is preferably 0.1° to 0.5°, and more preferably 0.3° to 0.4°. The inclination direction of the crystal plane is not particularly limited, but the crystal plane is preferably inclined in the direction of an M-axis, from the viewpoint of smoothness. Note that, since the present invention uses the C-plane AlN substrate, the crystal growth plane of the semiconductor layers grown on the substrate are C-plane too, as in the case of the substrate.

The crystal growth plane of the AlN substrate 11 is preferably smooth, from the viewpoint of preventing the occurrence of new dislocation at an interface between the AlN substrate and the semiconductor layer. To be more specific, a root mean square roughness (RMS) in an area of 5×5 μm$^2$ is preferably 5 nm or less, more preferably 1 nm or less, and further more preferably 0.5 nm or less. Such a smooth surface may be obtained, by known chemical mechanical polishing (CMP). The lower limit value of the RMS is preferably 0 nm, but is 0.05 nm, according to a present technology, in consideration of industrial productivity.

The AlN substrate 11 preferably has a high transmittance with respect to light from the finally formed light-emitting element or light for the finally formed light-receiving element. Therefore, an absorption coefficient in a deep ultraviolet region, more specifically, in wavelengths of 210 nm or more is preferably 25 cm$^{-1}$ or less. The lower limit value of the absorption coefficient is 0 cm$^{-1}$. However, in consideration of industrial productivity, measurement precision, and the like, the lower limit value of the absorption coefficient is 15 cm$^{-1}$ at a wavelength of 210 nm, and the lower limit value of the absorption coefficient is 5 cm$^{-1}$ at wavelengths of 250 nm or more. Using the AlN substrate having a low absorption, coefficient can prevent a deterioration in characteristics owing to absorption, of ultraviolet light in the AlN substrate 11.

The thickness of the AlN substrate 11 used in the present invention is not particularly limited. When the thickness of the AlN substrate is thin, the light absorption amount of the substrate can be reduced, even if the absorption coefficient is high. However, if the thickness is too thin, the AlN substrate may be difficult to handle and may reduce a yield of the element. Therefore, in general, the thickness is preferably 50 to 1000 μm. The AlN substrate 11 described above may be produced by, for example, sublimation described in the literature of "J. Cryst. Growth 312, 58-63 (2009)" and the literature of "Appl. Phys. Express 5, 055504 (2011)", hydride vapor phase epitaxy, or the like.

Note that the crystal growth plane of the AlN substrate 11 is not limited to the C-plane (C$^+$-plane), but may be, for example, an M-plane or an A-plane.

The buffer layer 12 is a single crystal AlN layer provided between the AlN substrate 11 and the n-type semiconductor layer 13. The buffer layer 12 is not indispensable in terms of the function of the light-emitting element or the light-receiving element. However, the buffer layer 12 is preferably provided from the viewpoints of preventing lattice relaxation of the n-type semiconductor layer 13 and increasing a yield of a crystal growth process. The layer thickness of the buffer layer 12 is not particularly limited, but is preferably 5 to 1000 nm, and more preferably 30 to 100 nm, in order to obtain the effect of preventing the lattice relaxation. The buffer layer 12 is in a pseudomorphic state with respect to the AlN substrate 11. The pseudomorphic state refers to a state in which the lattice constant of an a axis of the AlN substrate 11 is approximately equal to that of the buffer layer 12, and a lattice relaxation rate is ±5% or less. The lower limit value of the lattice relaxation rate is 0, and this state means that the lattice constant of the AlN substrate 11 absolutely coincides with that of the semiconductor layer. Note that the lattice relaxation rate may be measured by X-ray reciprocal lattice mapping measurement.

The n-type semiconductor layer 13 is a single crystal $Al_xGa_{1-x}N$ (0.5≤x≤1) layer having a band gap equal to or smaller than band gaps of the AlN substrate 11 and the buffer layer 12. Since the n-type semiconductor layer 13 is pseudomorphic with the AlN substrate 11, lattice relaxation, which is attended with the occurrence of dislocation, does not occur in the n-type semiconductor layer 13. Therefore, the dislocation density of the n-type semiconductor layer 13 is substantially equal to the dislocation density of a surface of the AlN substrate 11. Accordingly, the dislocation density of the n-type semiconductor layer 13 is preferably $10^6$ cm$^{-2}$ or less, and more preferably $10^4$ cm$^{-2}$ or less, just as with the AlN substrate 11. Note that, even in a case where the n-type semiconductor layer 13 is formed from a plurality of layers, all of the layers are pseudomorphic, and therefore have substantially equal dislocation densities.

The n-type semiconductor layer 13 contains, for example, Si as an n-type dopant. The concentration of the dopant of the n-type semiconductor layer 13 is not particularly limited, and can be appropriately determined in accordance with a purpose, To obtain a high conductivity, for example, the concentration of Si is preferably $1\times10^{18}$ cm$^{-3}$ to $5\times10^{19}$ cm$^{-3}$. Even in a case where the n-type semiconductor layer 13 is formed from, a plurality of layers, the concentration of Si of each layer is preferably $1\times10^{18}$ cm$^{-3}$ to $5\times10^{19}$ cm$^{-3}$. The concentration of Si of each layer may be constant, or may be different in accordance with design of the device. An interface between the layers may have a relatively high concentration of Si.

In the present embodiment, the n-type semiconductor layer 13 is composed of an AlGaN layer the Al composition of which is reduced in a growth direction, in other words, in a direction away from the AlN substrate 11 (direction heading to the active layer 14).

In the present embodiment, the n-type semiconductor layer 13 includes first and second composition gradient layers 13A and 13B the Al compositions of which are gradually reduced at different ratios from each other. To be more specific, the first composition gradient layer 13A is composed of an AlGaN layer that is grown above the AlN substrate 11, and has a gradually reduced Al composition from the AlN substrate 11 to the active layer 14 at a first rate (reduction rate).

The second composition gradient layer 13B is composed of an AlGaN layer that is grown above the first composition gradient layer 13A, and has an Al composition equal to or less than the Al composition of the first composition gradient layer 13A. The second composition gradient layer 13B is composed of an AlGaN layer that has a gradually reduced Al composition from the first composition gradient layer 13A to the active layer 14 at a second rate (reduction rate), which is lower than the first rate. Therefore, the n-type semiconductor layer 13 has a band gap as shown in FIG. 2.

As shown in FIG. 1, the second composition gradient layer 13B has a large layer thickness than the first composition gradient layer 13A. To be more specific, the first composition gradient layer 13A has a first layer thickness d1, and the second composition gradient layer 13B has a second layer thickness d2, which is larger than the first layer thickness d1. Note that, in the present embodiment, the entire n-type semiconductor layer 13 is a composition gradient layer having a layer thickness of D.

The active layer 14 is composed of an AlGaN layer having a band gap that is equal to or smaller than the band gap of the n-type semiconductor layer 13. In the present embodiment, the active layer 14 has a multiple quantum well structure, which is composed of a plurality of well layers and barrier layers. The active layer 14 emits light in a deep ultraviolet region. Note that, the structure of the active layer 14 is not limited thereto, but may be composed of a single layer, or may have a single quantum well structure.

The p-type semiconductor layer 15 is composed of an AlN layer, an AlGaN layer, or a GaN layer containing, for example, Mg as a p-type dopant. In the present embodiment, the p-type semiconductor layer 15 has a structure such that an electron block layer 15A composed of an AlN layer, a p-type clad layer 15B composed of an AlGaN layer, and a p-type contact layer 15C composed of a GaN layer are grown on or above the active layer 14. Therefore, the p-type semiconductor layer 15 has a band gap as shown in FIG. 2.

Note that the structure of the p-type semiconductor layer 15 is not limited to this. For example, the electron block layer 15A may not have the p-type dopant, or the electron block layer 15A may be absent.

The light-emitting element 10 has an n-electrode 16 formed on the n-type semiconductor layer 13, and a p-electrode 17 formed on the p-type semiconductor layer 15. In the present embodiment, as shown in FIG. 1, the active layer 14 and the p-type semiconductor layer 15 are partly removed, and the top surface of the n-type semiconductor layer 18 is exposed from the removed portion. The n-electrode 16 is formed on the exposed top surface of the n-type semiconductor layer 13. The p-electrode 17 is formed on the p-type semiconductor layer 15.

For example, the n-electrode is composed of a stacked body of a Ti layer, an Al layer, and an Au layer. The p-electrode 17 is composed of a stacked body of, for example, a Ni layer and an Au layer.

In the present embodiment, light emitted from the active layer 14 is taken out to the outside through the AlN substrate 11. In other words, the surface of the AlN substrate 11 opposite the n-type semiconductor layer 13 functions as a light taking-out surface. The light-emitting element 10 has a flip-chip mounting structure to be mounted on a mounting board (not shown) on the side of the n-electrode 16 and the p electrode 17.

Figure 3:
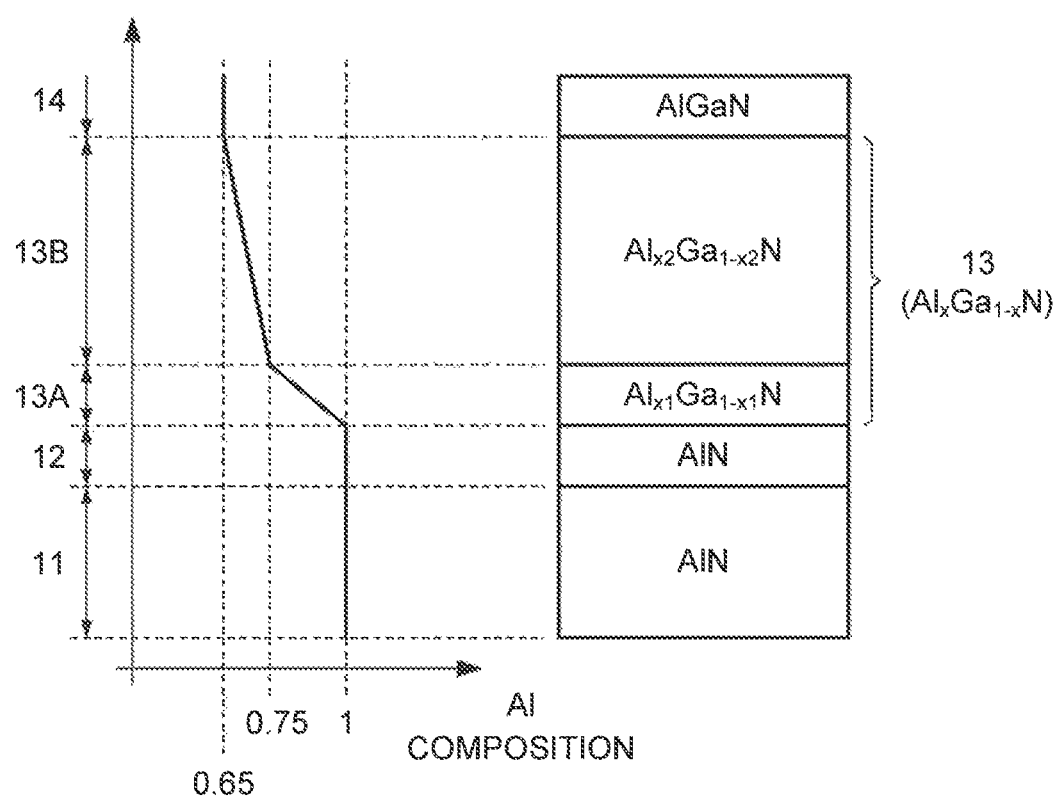
FIG. 3 is a diagram illustrating an example of the structure of the optical semiconductor element according to the first embodiment.

FIG. 3 schematically shows an example of the configuration of the n-type semiconductor layer 13 and the active layer 14 of the light-emitting element 10. The detailed configuration of the n-type semiconductor layer 13 will be described with reference to FIG. 3. The n-type semiconductor layer 13 has a composition of $Al_xGa_{1-x}N$ ($0.5 \le x \le 1$). In the present embodiment, the n-type semiconductor layer 13 is configured such that its Al composition x is gradually reduced, from 1 to 0.65.

The first composition gradient layer 15A of the n-type semiconductor layer 13 is configured to have a composition of $Al_{x1}Ga_{1-x1}N$ ($0.75 \le x1 \le 1$), and such that the Al composition x1 is linearly reduced from the AlN substrate 11 to the active layer 14. The second composition gradient layer 13B is configured to have a composition of $Al_{x2}Ga_{1-x2}N$ ($0.65 \le x2 \le 0.75$), and such that the Al composition x2 is linearly reduced from the first composition gradient layer 13A to the active layer 14.

Since the n-type semiconductor layer 13 is configured such that the Al composition is gradually reduced from the AlN substrate 11 (the buffer layer 12), it is possible to provide an appropriate layer thickness as the deep ultraviolet light-emitting element, while providing high quality. To be more specific, the inventors of the present application have focused attention on the fact that the critical film thickness of AlGaN of a high Al composition, (for example, an Al composition x is 0.5 or more) that is pseudomorphic on the AlN substrate 11 remains on the order of 1 µm.

This is conceivable to be caused by a large distortion occurring in an AlGaN layer (especially, an interface with AlN), during growth of AlGaN, on the basis of the difference in a lattice constant between AlN and AlGaN. However, in consideration of preventing an increase in an operation voltage (an electric resistance in the lateral direction), it is preferable that the AlGaN layer, functioning as the n-type semiconductor layer 13, has more layer thickness in the light-emitting element 10 as a deep ultraviolet light-emitting element. On the other hand, it is preferable to prevent a deterioration in crystalline quality.

The n-type semiconductor layer 13 prevents a sharp variation in the lattice constant by gradually varying the Al composition in the layer. For example, if the AlGaN layer has a uniform Al composition, a distortion concentrates at an interface with the AlN layer (the buffer layer 12). However, in the n-type semiconductor layer 13, small distortions occur gradually from the interface with the AlN layer (the buffer layer 12). Therefore, the distortion is alleviated in the entire n-type semiconductor layer 13.

Accordingly, the n-type semiconductor layer 13 can be configured as a pseudomorphic AlGaN layer having a layer thickness of 1 µm or more. Note that the inventors of the present application forecast that, even if a layer thickness D is 2 µm or more, the pseudomorphic n-type semiconductor layer 13 can be formed. Therefore, an electric resistance decreases in the n-type semiconductor layer 13 in a direction parallel to the n-type semiconductor layer 13, and hence it is possible to prevent an increase in the operation voltage. In the n-type semiconductor layer 13 having high crystalline quality, the light emitted from the active layer 14 is less absorbed. Therefore, it is possible to obtain high light taking-out efficiency.

In the present embodiment, the first composition gradient layer 13A is configured such that the Al composition x1 is reduced from 1 to 0.75 in the relatively small layer thickness d1. This is because, in the AlGaN layer functioning as the re-type semiconductor layer 13, when the Al composition x exceeds 0.8, a conductivity sharply decreases. To be more specific, in the n-type semiconductor layer 13, if the Al composition x is 0.8 or more in a large region, the conductivity of the entire n-type semiconductor layer 13 decreases, in other words, the electric resistance thereof increases. Therefore, it is preferable that the layer thickness is small at least until the Al composition becomes less than 0.8.

In the present embodiment, the first composition gradient layer 13A has a smaller layer thickness d1 than the layer thickness d2 of the second composition gradient layer 13B. Therefore, the ratio of the layer thickness d1 of the first composition gradient layer 13A relative to the layer thickness D of the entire n-type semiconductor layer 13 is small. Accordingly, in the entire n-type semiconductor layer 13, an electric resistance is prevented from increasing, and hence the operation voltage is prevented from increasing.

Note that, it is preferable that, in the first composition gradient layer 13A, which is provided on the side of the AlN substrate 11 relative to the second composition gradient layer 13B, the Al composition x1 is reduced at least from 0.95 to less than 0.8 from the AlN substrate 11 toward the second composition gradient layer 13B, irrespective of the above-described relationship between the layer thicknesses d1 and d2.

When the upper limit of the Al composition x1 is less than 0.95, the difference in the Al composition becomes large at an interface between the first composition gradient layer 13A and the AlN substrate 11 (the buffer layer 12). The difference in a refractive index between the AlN layer, including the AlN substrate 11 and the buffer layer 12, and the n-type semiconductor layer 13 thereby becomes large. Therefore, in the present embodiment, Fresnel reflection of light tends to occur between the buffer layer 12 and the n-type semiconductor layer 13. Accordingly, it becomes difficult to take the emitted light, from the active layer 14 out of the AlN substrate 11 to the outside, thus resulting in a reduction in light taking-out efficiency. When the lower limit of the Al composition x1 exceeds 0.8, the conductivity decreases in a larger region, as described above.

Note that the lower limit value of the Al composition at an interface of the first composition gradient layer 13A with the second composition gradient layer 13B can be appropriately determined in accordance with design of the element, but is preferably 0.7 from, the viewpoint of a reduction in distortion inside the crystal.

Therefore, the first composition gradient layer 13A is preferably configured to have a composition of $Al_{x1}Ga_{1-x1}N$ ($0.7 \le x1 \le 1$), and have a composition x1 that is linearly reduced from the AlN substrate 11 to the active layer 14. The first composition gradient layer 13A is preferably configured such that the Al composition x1 on the side of the AlN substrate 11 is within a range between 1 and 0.95, and the Al composition x1 is reduced at least from 0.95 to less than 0.8.

Next, as described above, the second composition gradient layer 13B has the larger layer thickness d2 than the first, composition gradient layer 13A. The second composition gradient layer 13B is configured such that the Al composition x2 is reduced more gently than the Al composition of the first composition gradient layer 13A. Therefore, in the n-type semiconductor layer 13, a portion having a high conductivity accounts for a large percentage. In the present embodiment, the n-electrode 16 is in contact with the second composition gradient layer 13B. Therefore, a large current flows between the n-electrode 16 and the active layer 14 through the second composition gradient layer 13B. Between the n-electrode 16 and the first composition gradient layer 13A, the second composition gradient layer 13B of, for example, 500 nm or more, and more preferably 1 μm or more is disposed. An increase in the operation voltage can be thereby prevented.

Note that, for example, the layer thickness d1 of the first composition gradient layer 13A is preferably within a range between 50 to 500 nm. For example, the layer thickness d2 of the second composition gradient layer 13B is preferably within a range between 0.5 to 2 μm. As an example of the configuration of the first and second composition gradient layers 13A and 13B, there is a case in which the layer thickness d1 of the first composition gradient layer 13A is less than half of the layer thickness d2 of the second composition gradient layer 13B. For example, the first composition gradient layer 13A may have a thickness of 300 nm, and the second composition gradient layer 13B may nave a thickness of 700 nm. This means that the Al composition inclines ⅔ or more of an entire Al composition inclination in a ⅓ area of the entire n-type semiconductor layer 13 on the side of the AlN substrate 11.

Considering above, for example, a preferable reduction rate (first rate) of the Al composition x1 in the first composition gradient layer 13A is within a range between 0.5 and 2/μm. For example, a preferable reduction rate (second rate) of the Al composition x2 in the second composition gradient layer 13B is within a range between 0.1 and 1/μm.

Figure 5:
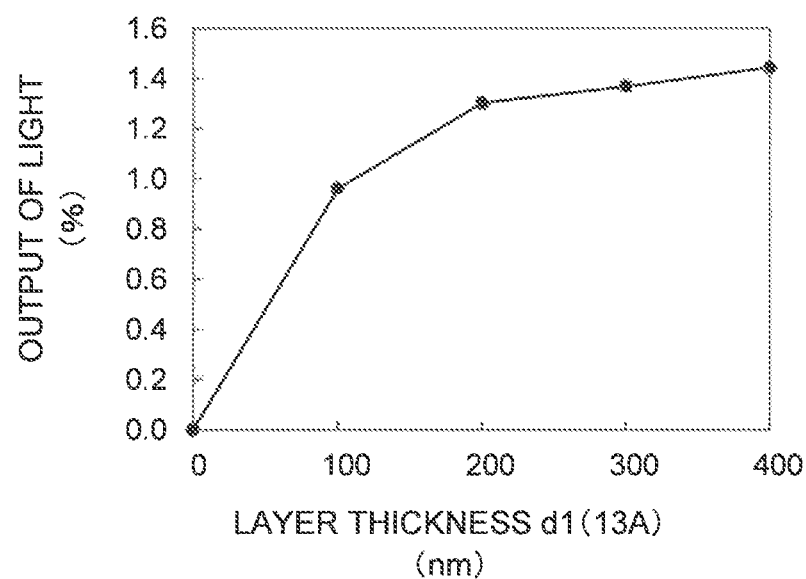
FIG. 5 is a graph showing the relationship between the layer thickness of the first composition gradient layer and a light amount in an AlN substrate, in the optical semiconductor element according to the first embodiment.

As shown in FIG. 5, the second composition gradient layer 13B preferably has the same Al composition at an interface with the first composition gradient layer 13A as the Al composition x1 of the first composition gradient layer 13A on the side of the second composition gradient layer 13B. This makes it possible to prevent a sharp variation in composition at the interface between the first and second composition gradient layers 13A and 13B, and thereby prevent a variation in refractive index. Therefore, it is possible to improve crystalline quality, while preventing an increase in the operation voltage.

In the present embodiment, the active layer 14 has a multiple quantum well structure that has four barrier layers having a composition of $Al_{0.65}Ga_{0.35}N$ and three well layers having a composition of $Al_{0.5}Ga_{0.5}N$. In the present embodiment, the light-emitting element 10 emits light having a wavelength of approximately 255 nm.

The barrier layer of the active layer 14 has an Al composition that is equal to or less than the Al composition at an interface of the second composition gradient layer 133 with the barrier layer. On or above the active layer 14, an AlN layer is grown as the electron block layer 15A, and an $Al_{0.8}Ga_{0.2}N$ layer is grown as the p-type clad layer 15B, and a GaN layer is grown as the p-type contact layer 15C. Note that, the p-type clad layer 15B, at an interface with the electron block layer 15A, has an Al composition that is equal to or more than the Al composition at the interface between the second composition gradient layer 13B and the active layer 14 (barrier layer).

Figure 4:
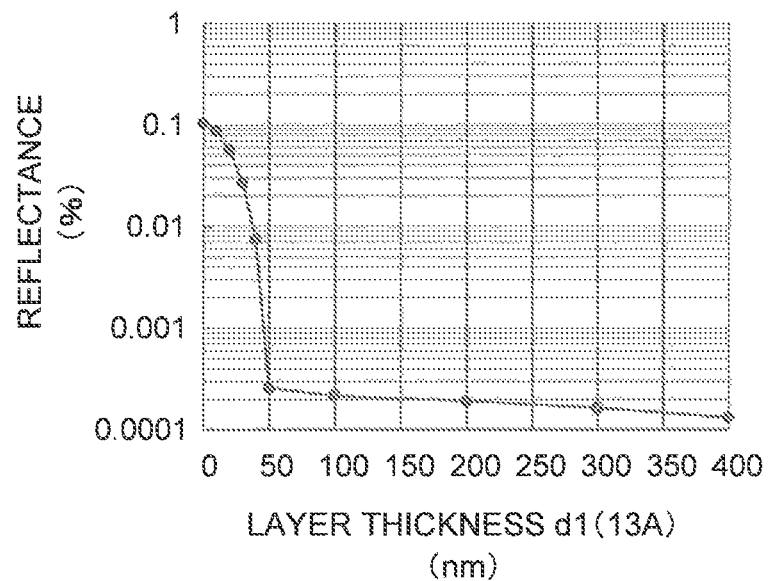
FIG. 4 is a graph showing reflectance at an interface between an n-type AlGaN layer and an AlN layer, relative to the layer thickness of a first composition gradient layer, in the optical semiconductor element according to the first embodiment.

Next, the more preferable layer thickness d1 of the first composition gradient layer 13A will be described with reference to FIGS. 4 and 5. FIG. 4 is a graph showing reflectance of light at an interface between the n-type semiconductor layer 13 (AlGaN layer; and the buffer layer 12 (AlN layer), relative to the layer thickness d1 of the first composition gradient layer 13A. FIG. 4 shows calculation results of reflectance at the interface in a case where the active layer 14 emits light having a wavelength of approximately 265 nm and the light is perpendicularly incident on the interface.

As shown in FIG. 4, when the layer thickness d1 of the first composition gradient layer 13A exceeds 50 nm, the reflectance sharply decreases. This 50 nm corresponds to ½ of the optical wavelength of the emitted light from the active layer 14 in the first composition gradient layer 13A.

Therefore, the layer thickness d1 of the first composition gradient layer 13A is preferably ½ or more of the optical wavelength of the emitted light from the active layer 14 in the first composition gradient layer 13A. This largely prevents reflection (Fresnel reflection) of light at the interface between the first composition gradient layer 13A and the buffer layer 12. This allows an improvement in light taking-out efficiency.

FIG. 5 shows calculation results in which ultraviolet light having a wavelength of 265 nm is incident from the side of the first composition gradient layer 13A at an incident angle of 0 to 90°, and an increase rate (relative to d1=0 nm, i.e. an increase rate 0%) of the amount of light that enters the AlN substrate is plotted with respect to the layer thickness d1. As shown in FIG. 3, the increase rate increases with an increase in the layer thickness d1 of the first composition gradient layer 13A. When the layer thickness exceeds about 200 nm, the increase rate tends to be saturated.

Figure 6:
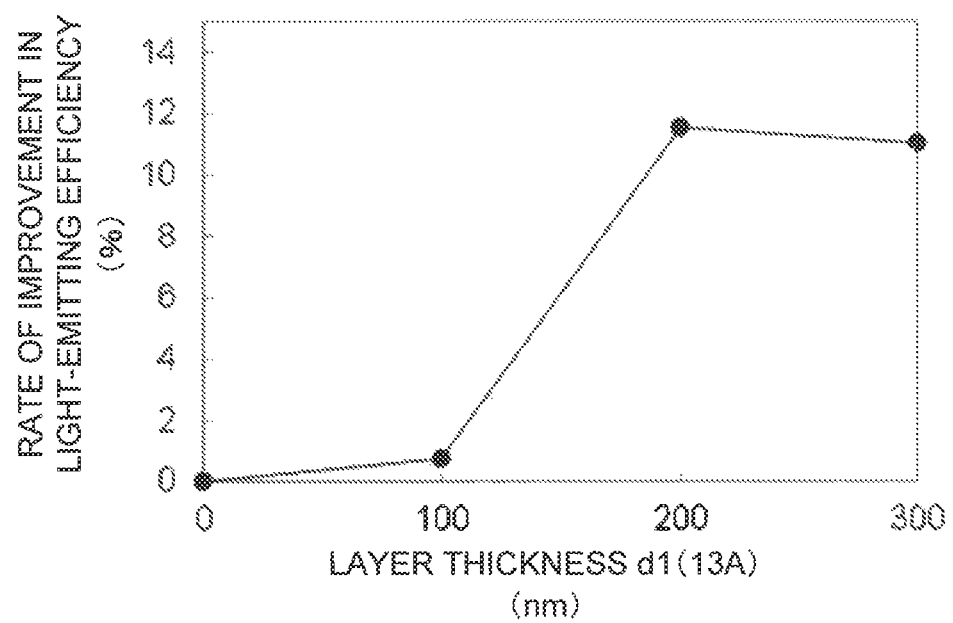
FIG. 6 is a graph showing the relationship between the layer thickness of the first composition gradient layer and the output of light, in the optical semiconductor element according to the first embodiment.

FIG. 6 shows an increase rate of the output of light from the light-emitting element 10 having the same structure as the structure used for calculation shown in FIG. 5. As shown in FIG. 6, the same results as the calculation results of FIG. 5 can be obtained by experiment. The results show that the output of light increases by 10% or more, when the layer thickness d1 of the first composition gradient layer 13A is 200 nm and 300 nm. The difference between the calculation result of FIG. 5 and the experiment result of FIG. 6 seems because, while the amount of light entering from the n-type semiconductor layer 13 into the AlN substrate 11 in a single path is estimated in the calculation, the effect of multiple reflection inside the semiconductor layers is added in the actual light-emitting element, and the effect of preventing the Fresnel reflection becomes more conspicuous.

Accordingly, the layer thickness d1 of the first composition gradient layer 13A is preferably 200 nm or more. Therefore, for example, the layer thickness d1 of the first composition gradient layer 13A is preferably within a range between 200 to 500 nm, and more preferably within a range between 200 to 350 nm. When the layer thickness d1 is 500 nm or more, the layer thickness D of the entire n-type semiconductor layer 13 becomes large, thus increasing the risk of lattice relaxation. From the viewpoint of preventing the Fresnel reflection, the similar effect can be obtained with a layer thickness d1 of 350 nm or more, and thus, the layer thickness d1 is preferably 350 nm or less in terms of productivity.

An example of the layer thickness of another layer in the light-emitting element 10 will be described below. For example, each of the well layers of the active layer 14 has a thickness of 3 nm. Each of the barrier layers of the active layer 14 has a layer thickness of 7 nm, except for the barrier layer closest to the p-type semiconductor layer 15. The barrier layer of the active layer 14 closest to the p-type semiconductor layer 15 has a layer thickness of 20 nm. The electron block layer 15A has a layer thickness of 9 nm. The p-type clad layer 15B as a layer thickness of 50 nm. The p-type contact layer 15C has a layer thickness of 250 nm.

Note that the present embodiment has described a case in which each of the first and second composition gradient layers 13A and 13B has the linear Al composition. However, the Al composition may be varied stepwise. In other words, a gradual reduction in the Al composition of the n-type semiconductor layer 13 means that the Al composition is reduced linearly or stepwise.

The present embodiment has described a case where the composition gradient layer is grown on the buffer layer 12 as the n-type semiconductor layer 13. However, the composition gradient layer may partly have a layer that does not contain the n-type dopant. For example, a composition gradient layer containing no n-type dopant may be provided between the buffer layer 12 and the n-type semiconductor layer 13. In other words, the non-doped, composition gradient layer and the composition gradient layer containing the n-type dopant may be laminated.

The present embodiment has described a case in which each of the first and second composition gradient layers 13A and 13B is composed of an AlGaN layer having a continuously reducing Al composition. However, each of the first and second composition gradient layers 13A and 13B may be an AlGaN layer having an equivalently reducing Al composition. To be more specific, the first or second composition gradient layer 13A or 13B may be configured to have a superlattice structure in which pairs of a well layer and a barrier layer, which are made of AlGaN, are laminated for a plurality of times, and to have the well layer the Al composition of which is reduced, stepwise toward the active layer 14.

The present embodiment has described a case in which the optical semiconductor element 10 is a semiconductor light-emitting element, but the optical semiconductor element 10 may be a light-receiving element that receives light in a deep ultraviolet region and generates an electric signal. In this case, for example, a surface of the AlN substrate 11 opposite the n-type semiconductor layer 13 functions as a light taking-in surface (light-receiving surface). In this case, since the n-type semiconductor layer 13 having high crystalline quality is formed so as to have a desired layer thickness D, it is possible to provide a semiconductor light-receiving element that operates at a low operation voltage with high light-receiving efficiency.

When the optical semiconductor element 10 is a semiconductor light-receiving element, the layer thickness d1 of the first composition gradient layer 13A may be equal to or more than an optical wavelength of light received by the active layer 14 inside the first composition gradient layer 13A. This prevents the reflection (Fresnel reflection) of light at the interface between the first composition gradient layer 13A and the buffer layer 12. Therefore, an increased amount of light is taken in through the AlN substrate 11, the buffer layer 12, and the n-type semiconductor layer 13. This results in an improvement in light-receiving efficiency (light taking-in efficiency).

Accordingly, the layer thickness d1 of the first composition gradient layer 13A is preferably equal to or more than the optical wavelength of light emitted from the active layer 14 or received by the active layer 14 in the first composition gradient layer 13A. Note that the light emitted from the active layer 14 or received by the active layer 14 refers to light that has a wavelength corresponding to the band gap of the active layer 14 and is in a wavelength band including the wavelength.

As described above, the optical semiconductor element 10 includes the AlN substrate 11, the n-type semiconductor layer 13 composed of the AlGaN layer which is grown on the AlN substrate 11, is pseudomorphic with the AlN substrate 11, and the Al composition of which is reduced with an increase in distance from the AlN substrate 11, the active layer 14 which is grown on the n-type semiconductor layer 13, and the p-type semiconductor layer 15 which is grown on the active layer 14. Therefore, it is possible to provide the deep ultraviolet optical semiconductor element 10 that has the n-type AlGaN layer having the desired layer thickness D, high quality, and high Al composition, and operates at a low operation voltage.

This application is based on a Japanese Patent application No. 2017-240978 which is hereby incorporated by reference.

What is claimed is:

1. An optical semiconductor element comprising:
    an AlN single crystal growth substrate;
    an n-type semiconductor layer composed of AlGaN layers, one of the AlGaN layers being grown on the AlN single crystal growth substrate and being pseudomorphic with the AlN single crystal growth substrate, Al compositions of the AlGaN layers being reduced with an increase in distance from the AlN single crystal growth substrate;
    an active layer which is grown on the n-type semiconductor layer; and
    a p-type semiconductor layer which is grown on the active layer;
    wherein a surface of the AlN single crystal growth substrate on an opposite side thereof from the n-type semiconductor layer is an outermost surface of the optical semiconductor element; and
    wherein the n-type semiconductor layer includes:
        a first composition gradient layer which is grown on the AlN single crystal growth substrate to have a composition of $Al_{x1}Ga_{1-x1}N$ ($0.7 \leq x1 \leq 1$) such that the Al composition x1 of the first composition gradient layer is within a range of 0.95 to 1 at a side thereof adjacent to an interface with the AlN single crystal growth substrate, and such that the Al composition x1 is gradually reduced at a first rate in a range of 0.5 to $2/\mu m$ from the side adjacent to the interface with the AlN single crystal growth substrate toward the active layer; and
        a second composition gradient layer which is grown on the first composition gradient layer such that the second composition gradient layer has a same Al composition at an interface between the first and second composition gradient layers as the Al composition x1 of the first composition gradient layer at the interface between the first and second composition gradient layers and such that the Al composition of the second composition gradient layer is gradually reduced at a second rate that is smaller than the first rate from the first composition gradient layer toward the active layer.

2. The optical semiconductor element according to claim 1, wherein, in the first composition gradient layer, the Al composition x1 is linearly reduced from the side adjacent to the interface with the AlN single crystal growth substrate toward the active layer.

3. The optical semiconductor element according to claim 1, wherein the first composition gradient layer has a smaller layer thickness than the second composition gradient layer.

4. The optical semiconductor element according to claim 1, wherein the first composition gradient layer has a layer thickness that is equal to or more than an optical wavelength of light emitted from the active layer or received by the active layer in the first composition gradient layer.

5. The optical semiconductor element according to claim 1, wherein the first composition gradient layer has a layer thickness of 200 nm or more.

6. The optical semiconductor element according to claim 5, wherein the Al composition of the first composition gradient layer at the interface between the first and second composition gradient layers is within a range of from 0.7 to 0.8.

7. The optical semiconductor element according to claim 6, wherein a thickness of the first composition gradient layer is within a range of 200 to 350 nm.

8. The optical semiconductor element according to claim 7, wherein a thickness of the second composition gradient layer is within a range of 0.5 to 2 µm.

9. The optical semiconductor element according to claim 1, wherein the second rate is in a range of 0.1 to 1/µm.

10. The optical semiconductor element according to claim 1, wherein a thickness of the AlN single crystal growth substrate is in a range of 50 to 1000 µm.

11. The optical semiconductor element according to claim 10, further comprising a buffer layer provided between the AlN single crystal growth substrate and the n-type semiconductor layer.

12. The optical semiconductor element according to claim 10, wherein each of the AlN single crystal growth substrate and the n-type semiconductor layer has a dislocation density of $10^6$ cm$^{-2}$ or less.

13. The optical semiconductor element according to claim 1, wherein:
the active layer has a multiple quantum well structure which comprises a plurality of well layers and a plurality of barrier layers, each of the barrier layers having a composition of $Al_yGa_{1-y}N$;
one of the plurality of barrier layers forms an interface with the second composition gradient layer; and
Al compositions y of the plurality of barrier layers are equal to or less than an Al composition at the interface of the second composition gradient layer and the one of the plurality of barrier layers.

14. The optical semiconductor element according to claim 1, wherein the optical semiconductor has an emission peak wavelength in a region of 200 to 300 nm.

15. The optical semiconductor element according to claim 1, wherein the surface of the AlN single crystal growth substrate on the opposite side thereof from the n-type semiconductor layer is a light emitting surface.

16. The optical semiconductor element according to claim 15, wherein the AlN single crystal growth substrate has an absorption coefficient in a deep ultraviolet region of 25 cm$^{-1}$ or less.

17. The optical semiconductor element according to claim 15, further comprising:
a n-electrode provided on a side of the n-type semiconductor layer opposite from where the AlN single crystal growth substrate is provided;
a p-electrode provided on a side of the p-type semiconductor layer opposite from where the AlN single crystal growth substrate is provided; and
a flip-chip mounting structure to be mounted on the n-electrode and the p-electrode.

18. A semiconductor light-emitting element having an emission peak wavelength in a region of 200 to 300 nm, the semiconductor light-emitting element comprising:
an AlN single crystal growth substrate which transmits ultraviolet light;
an n-type semiconductor layer which is formed on the AlN single crystal growth substrate and has a composition of $Al_xGa_{1-x}N$ (0.5≤x≤1);
an active layer which is formed on the n-type semiconductor layer and has a band gap that is equal to or smaller than a band gap of the n-type semiconductor layer;
a p-type semiconductor layer which is formed on the active layer and is composed of an AlN layer, an AlGaN layer, or a GaN layer;
a p-electrode which is formed on the p-type semiconductor layer; and
an n-electrode which is formed on an exposed top surface of the n-type semiconductor layer;
wherein:
the n-type semiconductor layer includes a first composition gradient layer having a composition of $Al_{x1}Ga_{1-x1}N$ (0.7≤x1≤1) and a second composition gradient layer having a composition of $Al_{x2}Ga_{1-x2}N$, the first and second composition gradient layers being formed this in order from the AlN single crystal growth substrate;
the Al composition x1 of the first composition gradient layer is reduced with an increase in distance from the AlN single crystal growth substrate;
the Al composition x1 of the first composition gradient layer is within a range of 0.95 to 1 at a side thereof adjacent to an interface with the AlN single crystal growth substrate;
the Al composition x1 of the first composition gradient layer is reduced toward the active layer from the side thereof adjacent to the interface with the AlN single crystal growth at a first rate in a range of 0.5 to 2/µm;
the first composition gradient layer has one surface in contact with the second composition gradient layer and another surface in contact with an AlN composition material;
the Al composition x2 of the second composition gradient layer is reduced with an increase in distance from the AlN single crystal growth substrate;
the Al composition x2 of the second composition gradient layer at an interface between the first and second composition gradient layers is the same as the Al composition x1 of the first composition gradient layer at the interface between the first and second composition gradient layers;
the Al composition x2 of the second composition gradient layer is reduced from an AlN single crystal growth substrate side toward the active layer at a second rate that is smaller than the first rate;
the second composition gradient layer has a larger layer thickness than the first composition gradient layer;
the layer thickness of the second composition gradient layer is at least 500 nm; and
the n-electrode is in contact with the second composition gradient layer, and electric current flows between the n-electrode and the active layer through the second composition gradient layer.

19. The semiconductor light-emitting element according to claim 18, wherein:
the n-electrode and the p-electrode are both made of metal materials and are provided a same side with respect to the AlN single crystal growth substrate,
a surface of the AlN single crystal growth substrate on the opposite side thereof from the n-type semiconductor layer is a light emitting surface for light emitted from the active layer.

20. The semiconductor light-emitting element according to claim 19, wherein the AlN single crystal growth substrate has a thickness in a range of 50 to 1000 µm.

21. The semiconductor light-emitting element according to claim 20, wherein the AlN single crystal growth substrate and the n-type semiconductor layer have a dislocation density of $10^6$ cm$^{-2}$ or less.

22. The semiconductor light-emitting element according to claim 18, wherein:
- a crystal growth plane of the AlN single crystal growth substrate on which the n-type semiconductor layer is layered is a C-plane, an M-plane, an A-plane, or a slightly inclined off-plane thereof;
- a buffer layer is provided between the AlN single crystal growth substrate and the first composition gradient layer;
- the buffer layer has a thickness in a range of 5 to 1000 nm; and
- a lattice constant of an a-axis of the AlN single crystal growth substrate is approximately equal to that of the buffer layer, and a lattice relaxation rate thereof is ±5% or less.

23. A semiconductor element having an emission peak wavelength in a region of 200 to 300 nm, the semiconductor light-emitting element comprising:
- an AlN single crystal growth substrate which transmits ultraviolet light;
- an n-type semiconductor layer which is formed on the AlN single crystal growth substrate and has a composition of $Al_xGa_{1-x}N$ (0.5≤x≤1);
- an active layer which is formed on the n-type semiconductor layer and has a band gap that is equal to or smaller than a band gap of the n-type semiconductor layer;
- a p-type semiconductor layer which is formed on the active layer and is composed of an AlN layer, an AlGaN layer, or a GaN layer;
- a p-electrode which is formed on the p-type semiconductor layer; and
- an n-electrode which is formed on an exposed top surface of the n-type semiconductor layer;

wherein:
- the n-type semiconductor layer includes a first composition gradient layer having a composition of $Al_{x1}Ga_{1-x1}N$ (0.7≤x1≤1) and a second composition gradient layer having a composition of $Al_{x2}Ga_{1-x2}N$, the first and second composition gradient layers being formed this in order from the AlN single crystal growth substrate;
- the Al composition x1 of the first composition gradient layer is reduced with an increase in distance from the AlN single crystal growth substrate;
- the Al composition x1 of the first composition gradient layer is within a range of 0.95 to 1 at a side thereof adjacent to an interface with the AlN single crystal growth substrate;
- the Al composition x1 of the first composition gradient layer is reduced toward the active layer from the side thereof adjacent to the interface with the AlN single crystal growth at a first rate in a range of 0.5 to 2/μm;
- the first composition gradient layer has one surface in contact with the second composition gradient layer and another surface in contact with an AlN composition material;
- the Al composition x2 of the second composition gradient layer is reduced with an increase in distance from the AlN single crystal growth substrate;
- the Al composition x2 of the second composition gradient layer at an interface between the first and second composition gradient layers is the same as the Al composition x1 of the first composition gradient layer at the interface between the first and second composition gradient layers;
- the Al composition x2 of the second composition gradient layer is reduced from an AlN single crystal growth substrate side toward the active layer at a second rate that is smaller than the first rate;
- the second composition gradient layer has a larger layer thickness than the first composition gradient layer;
- the layer thickness of the second composition gradient layer is at least 500 nm; and
- (i) the semiconductor element is a light emitting element, and a thickness of the first composition gradient layer is ½ or more of an optical wavelength of emitted light emitted from the active layer in the first composition gradient layer, or (ii) the semiconductor element is a light-receiving element, and a thickness of the first composition gradient layer is equal to or more than an optical wavelength of light received by the active layer inside the first composition gradient layer.

* * * * *